United States Patent
Wu

(10) Patent No.: US 11,989,453 B2
(45) Date of Patent: May 21, 2024

(54) PRODUCTION STATE AWARENESS SELECTION

(71) Applicant: Micron Technology, Inc., Boise, ID (US)

(72) Inventor: Minjian Wu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 17/678,210

(22) Filed: Feb. 23, 2022

(65) Prior Publication Data

US 2023/0266920 A1  Aug. 24, 2023

(51) Int. Cl.
*G06F 3/06* (2006.01)
*G11C 7/04* (2006.01)
*G11C 16/04* (2006.01)
*G11C 16/34* (2006.01)

(52) U.S. Cl.
CPC .......... *G06F 3/0659* (2013.01); *G06F 3/0604* (2013.01); *G06F 3/0625* (2013.01); *G06F 3/0634* (2013.01); *G06F 3/0679* (2013.01); *G11C 7/04* (2013.01); *G11C 16/0483* (2013.01); *G11C 16/3418* (2013.01); *G11C 2211/5641* (2013.01)

(58) Field of Classification Search
CPC ....... G11C 16/08; G11C 16/10; G11C 16/102; G11C 16/14; G11C 16/16; G11C 16/23; G11C 16/26; G11C 16/3459; G11C 16/349; G11C 16/3418; G11C 11/5628; G11C 11/5621; G11C 2211/5641; G11C 7/04; G11C 29/4401; G06F 3/0634; G06F 3/0679; G06F 3/0619; G06F 3/0659; G06F 3/0644; G06F 3/0625; G06F 3/0604; G06F 2212/1032
See application file for complete search history.

(56) References Cited

U.S. PATENT DOCUMENTS

| | | | | |
|---|---|---|---|---|
| 2008/0250220 | A1* | 10/2008 | Ito | G06F 12/0246 711/E12.001 |
| 2013/0308390 | A1* | 11/2013 | Lee | G11C 11/5628 365/185.22 |
| 2014/0063900 | A1* | 3/2014 | Heller | G01N 25/02 374/185 |
| 2014/0281170 | A1* | 9/2014 | Cho | G06F 3/0634 711/103 |
| 2018/0322041 | A1* | 11/2018 | Chiu | G06F 9/3004 |
| 2019/0066775 | A1* | 2/2019 | Jean | G11C 16/3459 |
| 2020/0327934 | A1 | 10/2020 | Jean et al. | |
| 2021/0149798 | A1 | 5/2021 | Liang | |

OTHER PUBLICATIONS

JEDEC, Embedded Multi-Media Card (eMMC) Electrical Standard (5.0), Sep. 2023, JEDEC Solid State Technology Association, Revision JESD84-B50, pp. 1-296 (Year: 2013).*

* cited by examiner

*Primary Examiner* — Curtis James Kortman
(74) *Attorney, Agent, or Firm* — Brooks, Cameron & Huebsch, PLLC

(57) ABSTRACT

A production host can learn the production state awareness (PSA) modes supported by a memory device and select a particular of one of the supported PSA modes. The memory device can receive host image data from the production host and write the host image data according to the selected PSA mode. The memory device can set a PSA state to load complete after writing the host image data. The memory device can thereby be better situated for being soldered to a memory sub-system.

19 Claims, 5 Drawing Sheets

PRODUCTION STATE AWARENESS SELECTION

TECHNICAL FIELD

The present disclosure relates generally to semiconductor memory and methods, and more particularly, to apparatuses, systems, and methods for production state awareness selection.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

Vehicles are becoming more dependent upon memory sub-systems to provide storage for components that were previously mechanical, independent, or non-existent. A vehicle can include a computing system, which can be a host for a memory sub-system. The computing system can run applications that provide component functionality. The vehicle may be driver operated, driver-less (autonomous), and/or partially autonomous. The memory device can be used heavily by the computing system in a vehicle.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
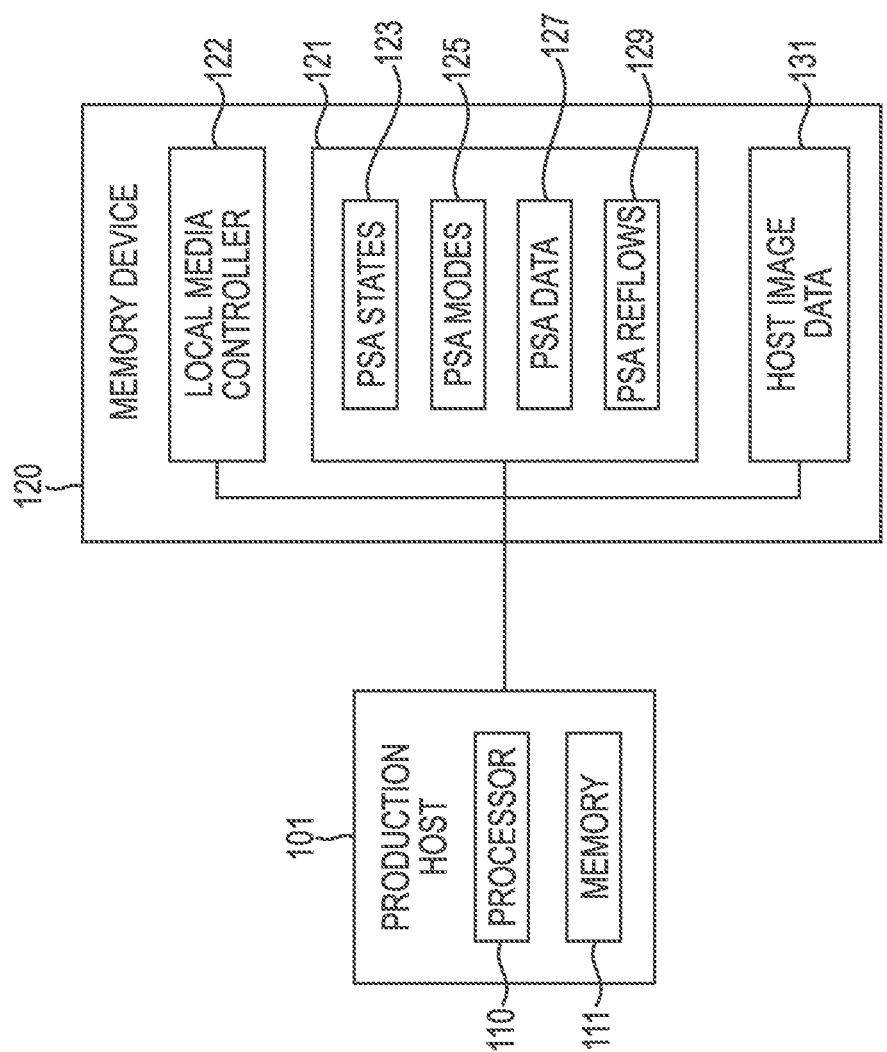
FIG. 1 is a block diagram of a memory device coupled to a production host in accordance with some embodiments of the present disclosure.

Aspects of the present disclosure are directed to production state awareness selection for a memory device prior to being soldered to a memory sub-system, which may later be included in a vehicle. Normally, production host image data (such as an operating system) is programmed to the memory device before it is soldered to a circuit board (e.g., a memory sub-system). As used herein, a production host is a host that is coupled to a memory device for production purposes, such as programming host image data, testing, etc., before the memory device is soldered to a memory sub-system, sold or shipped to a customer, or used in the field. Subsequent to being coupled to a production host, the memory device is typically coupled to a host (e.g., a regular or operation host).

Production state awareness (PSA) is a feature defined to identify which data is written before the soldering process occurs. A memory device or production host can use this information and adjust internal operations accordingly to avoid data corruption during the soldering stage, which typically involves subjecting the memory device, or portions thereof, to high temperatures. However, memory devices are produced for a wide variety of customers that have varying usage models. For example, some customers may wish to limit how the quantity of reflows to which a memory device is subjected (e.g., one reflow, two reflows, three reflows, etc.). Reflow generally refers to exposing at least a portion of the memory device to a heat source to reform the solder connections to a memory sub-system. As another example, different customers may have significantly different amounts of (or portions of the capacity of the memory device that they wish to use for storage of) host image data during production (e.g., ⅓ capacity, ½ capacity, etc.).

The memory device may be a non-volatile memory device, such as not-and (NAND) type flash memory. NAND type flash memory includes, for example, two-dimensional NAND (2D NAND) and three-dimensional NAND (3D NAND). Non-volatile memory devices can include one or more arrays of memory cells. The memory cells can be operated as single level cells (SLC) to store one bit per cell. The memory cells can be operated as multi-level cells (MLCs) to store two bits per cell, triple level cells (TLCs) to store three bits per cell, quad-level cells (QLCs) to store four bits per cell, and penta-level cells (PLCs) to store five bits per cell, among other examples including storing fractional bits per cell. As memory technology has developed it has become more difficult to meet customer performance and reflow requirements while maintaining the integrity of the host image data stored on the memory device.

Aspects of the present disclosure address the above and other deficiencies by introducing an interface for selecting different PSA modes, which can allow the customer to configure the memory device for operation in a manner that best suits the customer's desired or expected usage of the memory device. The memory device can store different PSA modes including different quantities of bits per cell for programming host image data, different trim sets for programming host image data, different memory capacity to be allocated for host image data, different performance envelopes, and/or different reflow capabilities, etc. The memory device can advertise the PSA modes to a production host for selection prior to programming the host image data.

The figures herein follow a numbering convention in which the first digit or digits correspond to the drawing figure number and the remaining digits identify an element or component in the drawing. Similar elements or components between different figures may be identified by the use of similar digits. For example, 120 may reference element "20" in FIG. 1, and a similar element may be referenced as 220 in FIG. 2. Analogous elements within a Figure may be referenced with a hyphen and extra numeral or letter. Such analogous elements may be generally referenced without the hyphen and extra numeral or letter. For example, elements 106-1, 106-2, . . . , 106-N in FIG. 1 may be collectively referenced as 106. As used herein, the designator "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of a memory device 120 coupled to a production host 101 in accordance with some embodiments of the present disclosure. The production host 101 includes or is coupled to a processor 110 and memory 111. Examples of the production host 101 include a computer and a testing circuit, among others.

Figure 2:
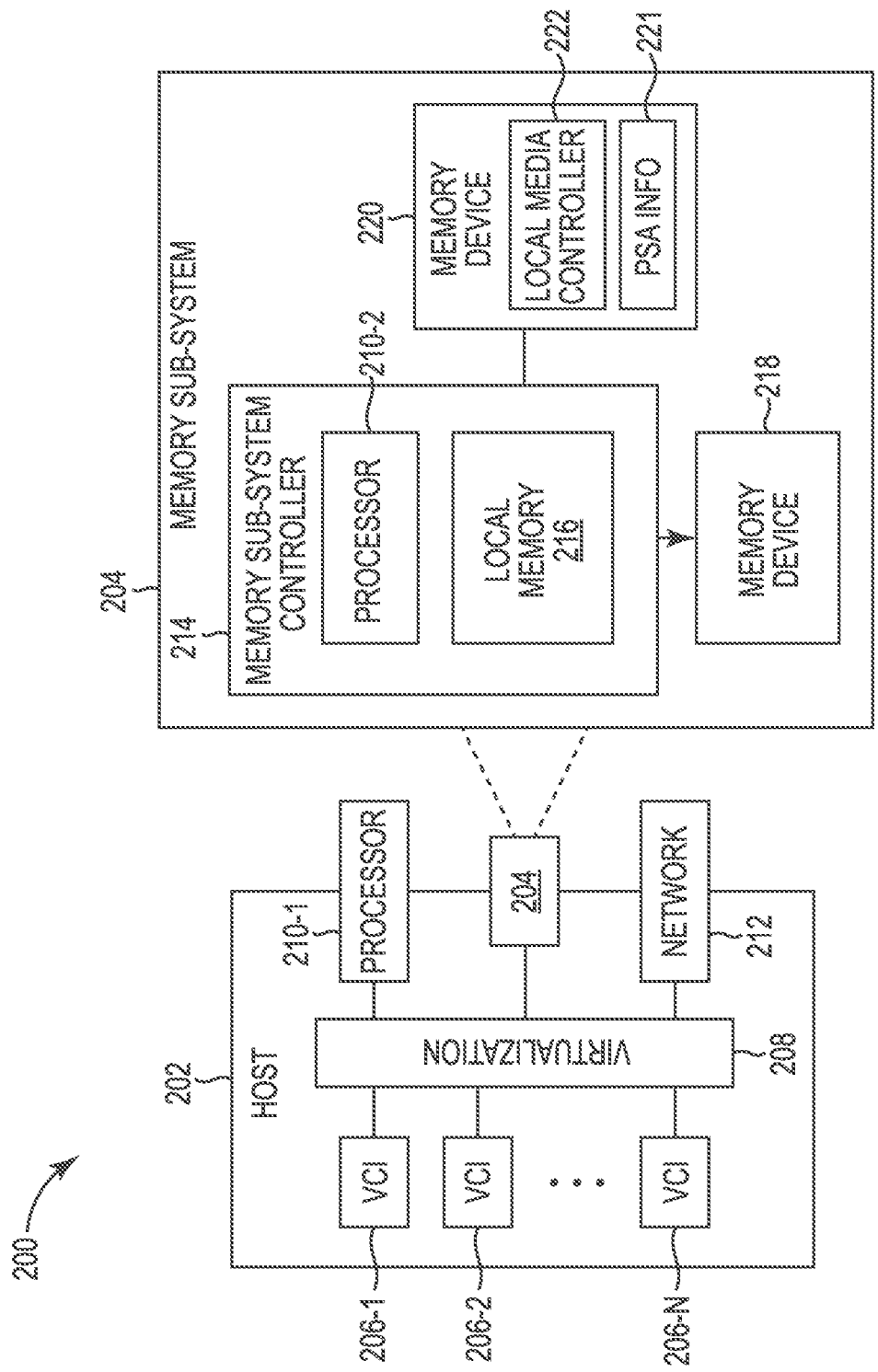
FIG. 2 is a block diagram of an example computing system that includes a memory sub-system in accordance with some embodiments of the present disclosure.

The production host 101 can be coupled to the memory sub-system 104 via a physical production host interface analogous to that described in more detail with respect to FIG. 2. The production host interface can provide an interface for passing control, address, data, and other signals between the memory device 120 and the production host 101. The production host 101 can send requests to the memory device 120, for example, to store data in the memory device 120 or to read data from the memory device 120. Some of the data to be written as specified by a production host request, is referred to herein as host image data 131.

The memory device 120 can be a non-volatile memory device that includes NAND flash memory. The memory device 120 can be another type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), and three-dimensional cross-point memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory device 120 can include one or more arrays of memory cells. The memory cells can be grouped as pages that can refer to a logical unit of the memory device used to store data. With some types of memory (e.g., NAND), pages can be grouped to form blocks. Although not specifically illustrated in FIG. 1, the host image data 131 can be stored in a memory array of the memory device 120.

In some embodiments, the memory device 120 includes a local media controller 122 that can operate in conjunction with the production host 101 to execute operations on one or more memory cells of the memory device 120. In some embodiments, the memory device 120 is a managed memory device, which is a raw memory device combined with a local controller (e.g., local controller 122) for media management within the same memory device package. An example of a managed memory device is a managed NAND device.

In at least one embodiment, the circuitry block labeled 121 represents registers, such as universal flash storage (UFS) descriptors or embedded multimedia card (eMMC) extended card specific data (ECSD) registers. In some embodiments, the registers 121 can comprise an application specific integrated circuit (ASIC) configured to perform the examples described herein. The registers 121 can be readable via the production host interface. In some embodiments, a local media controller 122 of the memory device 120 includes at least a portion of the registers 121. The local media controller 122 can include a processor (e.g., processing device) configured to execute instructions for performing the operations described herein. In at least one embodiment, the registers 121 represent data or instructions stored in the memory device 120. The functionality described with respect to the registers 121 can be embodied in machine-readable and executable instructions stored in a tangible machine-readable medium.

The registers 121 can store data indicative of a PSA state 123 of the memory device. For example, an initial PSA state for the memory device can indicate that it has not been programmed with host image data 131. The memory device can reprogram the data indicative of the PSA state 123 after programming the host image data 131 and before the memory device 120 is soldered to the memory sub-system. This PSA state 123 can be referred to as "load complete." In some embodiments, the data indicative of the PSA state 123 can be programmed as "load complete" by the production host 101 either directly or by the memory device 120 in response to signaling indicative of the load complete state from the production host 101. After the memory device 120 is programmed with the host image data 131 it can be shut down. Upon a subsequent startup, the memory device 120 can reprogram the PSA state. This PSA state can be referred to as "soldered," which indicates that the memory device 120 has been soldered to the memory sub-system. It may be assumed that after the memory device 120 is programmed with the host image data 131 and shut down that it will be soldered to the memory sub-system before powering up again.

The registers 121 can store data indicative of PSA modes 125 supported by the memory device 120. The memory device 120 can transmit signals indicative of the supported PSA modes 125 (data stored in the registers 121) via the production host interface (e.g., in response to a PSA request received via the production host interface) so that the production host 101 can learn what PSA modes the memory device 120 supports. The memory device 120 can receive signals indicative of a selection of a PSA mode 125 via the production host interface. The memory device 120 can program data indicative of the selected PSA mode 125 to the registers 121. The memory device 120 can receive signals indicative of the host image data 131 via the production host interface and program the host image data 131 to the memory array according to the selected PSA mode 125. The registers 121 can store data indicative of a quantity of reflows 129 supported by the memory device 120. The data indicative of the quantity of reflows 129 can be correlated with the PSA modes 127 (e.g., the memory device 120 can support a different quantity of reflows based on which PSA mode 125 in which it is set to operate).

In an example first PSA mode, the memory device can be configured to program the host image data 131 to memory cells of the memory array at a first quantity of bits per cell. In an example second PSA mode, the memory device 120 can be configured to program the host image data 131 to memory cells of the memory array at a second quantity of bits per cell greater than the first quantity (e.g., at a greater data density per cell). In these examples, the first PSA mode would provide relatively greater data reliability, relatively faster programming performance, and potentially support a greater quantity of reflows versus the second PSA mode.

In an example first PSA mode, the memory device 120 can be configured to program the host image data 131 to memory cells of the memory array with a first trim set. In an example second PSA mode, the memory device 120 can be configured to program the host image data 131 to memory cells of the memory array with a second trim set providing lesser reflow capability than the first PSA mode. Trim sets can include operating parameters associated with various operations such as program (write), program verify, erase, erase verify, and sense (read), among other operations associated with an array of memory cells. Examples of trims include programming voltages, programming frequency, and programming time length.

Trim sets can be used to achieve or adjust desired threshold voltage (Vt) distributions and/or the voltage spread between different Vt distributions for different data states for memory cells of the memory device 120. Trim sets can be used to cause the memory device 120 to be operated with different program times. Different trim sets can be used for different operations such as programming, reading, and erasing, to achieve different performance targets such as programming speed, reading speed, data retention over time (how long a memory cell reliably stores the data programmed thereto), and memory cell endurance (how reliably a memory cell operates after various quantities of program/erase cycles). The effects of different trim sets on different performance targets can be known based on testing, historical observation, theoretical modeling, active monitoring of the operation of a memory device, and other methods. For example, a faster programming time may provide better programming speed, but may yield relatively poor data retention over time. A slower programming time may provide slower programming speed but may yield better data retention over time.

Examples of trim sets include a program start voltage, a program step voltage, a program inhibit start voltage, and an erase verify voltage. The program start voltage is the magnitude of an initial programming voltage pulse of a series of voltage pulses applied to a selected word line during a programming operation performed on memory cells in a selected block. The program step voltage is the voltage step size between programming voltage pulses. The program inhibit start voltage is a voltage used to inhibit further programming of memory cells once the Vt level associated with a desired data state has been reached. The erase verify voltage is the voltage used to check whether memory cells in the selected block have a Vt level indicative of the erase state.

In an example first PSA mode, the memory device can be configured to limit the host image data 131 to a first portion of a capacity of the memory array (e.g., one third, one half, etc.). In an example second PSA mode, the memory device 120 can be configured to limit the host image data 131 to a second portion of the capacity of the memory array (e.g., one half, all, etc.) greater than the first portion. In these examples, the first PSA mode could support a greater quantity of reflows versus the second PSA mode.

FIG. 2 is a block diagram of an example computing system 200 that includes a memory sub-system 204 in accordance with some embodiments of the present disclosure. The memory sub-system 204 can include media, such as one or more volatile memory devices 218, one or more non-volatile memory devices 220, or a combination thereof. The volatile memory devices 218 can be, but are not limited to, random access memory (RAM), such as dynamic random access memory (DRAM), synchronous dynamic random access memory (SDRAM), and resistive DRAM (RDRAM).

A memory sub-system 204 can be a storage device, a memory module, or a hybrid of a storage device and memory module. Examples of a storage device include an SSD, a flash drive, a universal serial bus (USB) flash drive, an eMMC drive, a UFS drive, a secure digital (SD) card, and a hard disk drive (HDD). In at least one embodiment, the memory sub-system 204 is an automotive grade SSD. Examples of memory modules include a dual in-line memory module (DIMM), a small outline DIMM (SO-DIMM), and various types of non-volatile dual in-line memory module (NVDIMM).

The computing system 200 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 200 includes a host system 202 that is coupled to one or more memory sub-systems 204. The host system 202 is an operational host as opposed to the production host 101 illustrated in FIG. 1. In some embodiments, the host system 202 is coupled to different types of memory sub-systems 204. FIG. 2 illustrates an example of a host system 202 coupled to one memory sub-system 204. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 202 includes or is coupled to processing resources, memory resources, and network resources. As used herein, "resources" are physical or virtual components that have a finite availability within a computing system 200. For example, the processing resources include a processing device 210-1 (or a number of processing devices), the memory resources include memory sub-system 204 for secondary storage and main memory devices (not specifically illustrated) for primary storage, and the network resources include as a network interface 212. The processing device 210-1 can be one or more processor chipsets, which can execute a software stack. The processing device 210-1 can include one or more cores, one or more caches, a memory controller (e.g., NVDIMM controller), and a storage protocol controller (e.g., PCIe controller, SATA controller, etc.). The host system 202 uses the memory sub-system 204, for example, to write data to the memory sub-system 204 and read data from the memory sub-system 204.

The host system 202 can be configured to provide virtualized or non-virtualized access to the memory sub-system 204 and/or the processing resources and network resources. Virtualization can include abstraction, pooling, and automation of the processing, memory, and/or network resources. FIG. 2 generally illustrates the host system 202 providing virtualized access.

To provide such virtualization, the host system 202 incorporates a virtualization layer 208 (e.g., hypervisor, virtual machine monitor, etc.) that can execute a number of virtual computing instances (VCIs) 206-1, 206-2, . . . , 206-N. The virtualization layer 208 can provision the VCIs 206 with processing resources and memory resources and can facilitate communication for the VCIs 206 via the network interface 212. The virtualization layer 208 represents an executed instance of software run by the host system 202. The term "virtual computing instance" covers a range of computing functionality. VCIs may include non-virtualized physical hosts, virtual machines (VMs), and/or containers. The VCIs 206 can therefore represent applications that run on the virtualization layer 208 or on an operating system executed by the host system 202. By way of example, the first VCI 206-1 is an application that provides an instrument cluster for a vehicle, the second VCI 206-2 is an application that provides a black box for the vehicle, and the third VCI 206-N is an application that provides an infotainment system for the vehicle. Embodiments are not limited to these specific examples of applications.

The host system 202 can be coupled to the memory sub-system 204 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 202 and the memory sub-system 204. The host system 202 can further utilize an NVM Express (NVMe) interface to access the non-volatile memory devices 220 when the memory sub-system 204 is coupled with the host system 202 by the PCIe interface. The physical host interface can provide an interface for passing control, address, data, and other signals between the memory sub-system 204 and the host system 202. FIG. 2 illustrates a memory sub-system 204 as an example. In general, the host system 202 can access multiple memory sub-systems via a same communication connection, multiple separate communication connections, and/or a combination of communication connections.

The host system 202 can send requests to the memory sub-system 204, for example, to store data in the memory sub-system 204 or to read data from the memory sub-system 204. The data to be written or read, as specified by a host request, is referred to as "host data." A host request can include logical address information. The logical address information can be a logical block address (LBA), which may include or be accompanied by a partition number. The logical address information is the location the host system associates with the host data. The logical address information can be part of metadata for the host data. The LBA may also correspond (e.g., dynamically map) to a physical address, such as a physical block address (PBA), that indicates the physical location where the host data is stored in memory.

The memory sub-system controller 214 (or controller 214 for simplicity) can communicate with the non-volatile memory devices 220 to perform operations such as reading data, writing data, erasing data, and other such operations at the non-volatile memory devices 220. The memory sub-system controller 214 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 214 can be a microcontroller, special purpose logic circuitry (e.g., a field programmable gate array (FPGA), an ASIC, etc.), or other suitable circuitry.

The memory sub-system controller 214 can include a processing device 210-2 (e.g., a processor) configured to execute instructions stored in local memory 216. In the illustrated example, the local memory 216 of the memory sub-system controller 214 is an embedded memory configured to store instructions for performing various processes, operations, logic flows, and routines that control operation of the memory sub-system 204, including handling communications between the memory sub-system 204 and the host system 202.

In some embodiments, the local memory 216 can include memory registers storing memory pointers, fetched data, etc. The local memory 216 can also include ROM for storing micro-code, for example. While the example memory sub-system 204 in FIG. 2 has been illustrated as including the memory sub-system controller 214, in another embodiment of the present disclosure, a memory sub-system 204 does not include a memory sub-system controller 214, and can instead rely upon external control (e.g., provided by an external host, or by a processor or controller separate from the memory sub-system 204).

In general, the memory sub-system controller 214 can receive information or operations from the host system 202 and can convert the information or operations into instructions or appropriate information to achieve the desired access to the non-volatile memory devices 220 and/or the volatile memory devices 218. The memory sub-system controller 214 can be responsible for other operations such as media management operations (e.g., wear leveling operations, garbage collection operations, defragmentation operations, read refresh operations, etc.), error detection and/or correction operations, encryption operations, caching operations, and address translations between a logical address (e.g., logical block address) and a physical address (e.g., physical block address) associated with the non-volatile memory devices 220. The memory sub-system controller 214 can further include host interface circuitry to communicate with the host system 202 via the physical host interface. The host interface circuitry can convert a query received from the host system 202 into a command to access the non-volatile memory devices 220 and/or the volatile memory devices 218 as well as convert responses associated with the non-volatile memory devices 220 and/or the volatile memory devices 218 into information for the host system 202.

Figure 3:
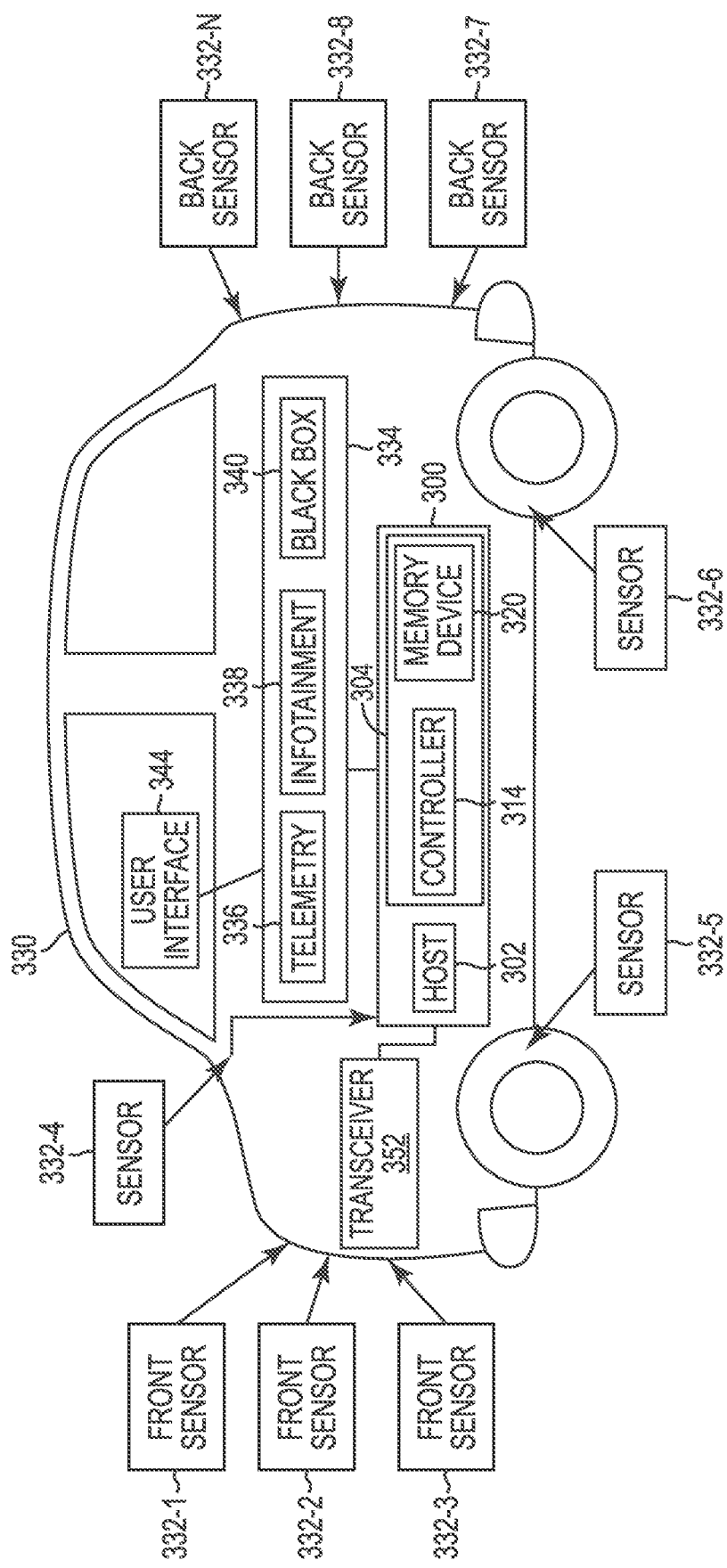
FIG. 3 illustrates an example of a system including a computing system in a vehicle in accordance with some embodiments of the present disclosure.

FIG. 3 illustrates an example of a system including a computing system 300 in a vehicle 330 in accordance with some embodiments of the present disclosure. The computing system 300 can include a memory sub-system 304, which is illustrated as including a controller 314 and non-volatile memory device 320 for simplicity but is analogous to the memory sub-system 204 illustrated in FIG. 2.

The computing system 300, and thus the host 302, can be coupled to a number of sensors 332 either directly, as illustrated for the sensor 332-4 or via a transceiver 352 as illustrated for the sensors 332-1, 332-2, 332-3, 332-5, 332-6, 332-7, 332-8, . . . , 332-N. The transceiver 352 is able to receive data from the sensors 332 wirelessly, such as by radio frequency communication. In at least one embodiment, each of the sensors 332 can communicate with the computing system 300 wirelessly via the transceiver 352. In at least one embodiment, each of the sensors 332 is connected directly to the computing system 300 (e.g., via wires or optical cables).

The vehicle 330 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 332 are illustrated in FIG. 3 as including example attributes. For example, sensors 332-1, 332-2, and 332-3 are cameras collecting data from the front of the vehicle 330. Sensors 332-4, 332-5, and 332-6 are microphone sensors collecting data from the from the front, middle, and back of the vehicle 330. The sensors 332-7, 332-8, and 332-N are cameras collecting data from the back of the vehicle 330. As another example, the sensors 332-5, 332-6 are tire pressure sensors. As another example, the sensor 332-4 is a navigation sensor, such as a global positioning system (GPS) receiver. As another example, the sensor 332-6 is a speedometer. As another example, the sensor 332-4 represents a number of engine sensors such as a temperature sensor, a pressure sensor, a voltmeter, an ammeter, a tachometer, a fuel gauge, etc. As another example, the sensor 332-4 represents a camera. Video data can be received from any of the sensors 332 associated with the vehicle 330 comprising cameras. In at least one embodiment, the video data can be compressed by the host 302 before providing the video data to the memory sub-system 304.

The host 302 can execute instructions to provide an overall control system and/or operating system for the vehicle 330. The host 302 can be a controller designed to assist in automation endeavors of the vehicle 330. For example, the host 302 can be an advanced driver assistance system controller (ADAS). An ADAS can monitor data to prevent accidents and provide warning of potentially unsafe situations. For example, the ADAS can monitor sensors in the vehicle 330 and take control of vehicle 330 operations to avoid accident or injury (e.g., to avoid accidents in the case of an incapacitated user of a vehicle). The host 302 may need to act and make decisions quickly to avoid accidents. The memory sub-system 304 can store reference data in the non-volatile memory device 320 such that data from the sensors 332 can be compared to the reference data by the host 302 in order to make quick decisions.

The host 302 can write data received from one or more sensors 332 and store the data (e.g., in association with a black box application 340 for the vehicle). The black box application 340 may also be referred to as an accident data recorder. With the advent of autonomous vehicles, some autonomous driving requires real time buffering of telemetric data such as video cameras, RADAR, LIDAR, ultrasonic and other sensors necessary to playback the sequences preceding an accident. Upon an event, a quantity (e.g., thirty seconds) of playback time immediately preceding an event needs to be captured to determine the cause of an incident. A playback may be referred to as a "snapshot". The application that controls storage of such information is referred to herein as a black box. A black box may need to store at least a few, most recent snapshots.

The host 302 can execute instructions to provide a set of applications 334 for the vehicle 330 including telemetry 336, infotainment 338, and a black box 340. The telemetry application 336 can provide information displayable on a user interface 344 such as may be associated with the instrumentation and/or dashboard of a vehicle 330. An example of such telemetric information is the speed at which the vehicle 330 is traveling (e.g., based at least in part on data from a sensor 332). The infotainment application 338 can include information and/or entertainment for a user of the vehicle 330 displayable or interfaced via the user interface 344. Examples of such information and/or entertainment include music, movies, GPS information such as a moving map, etc. The memory sub-system 304 can provide storage for any of the set of applications 334. The set of applications 334 can be virtualized, as described with respect to FIG. 2, with backing storage provided by the memory sub-system 304.

Figure 4:
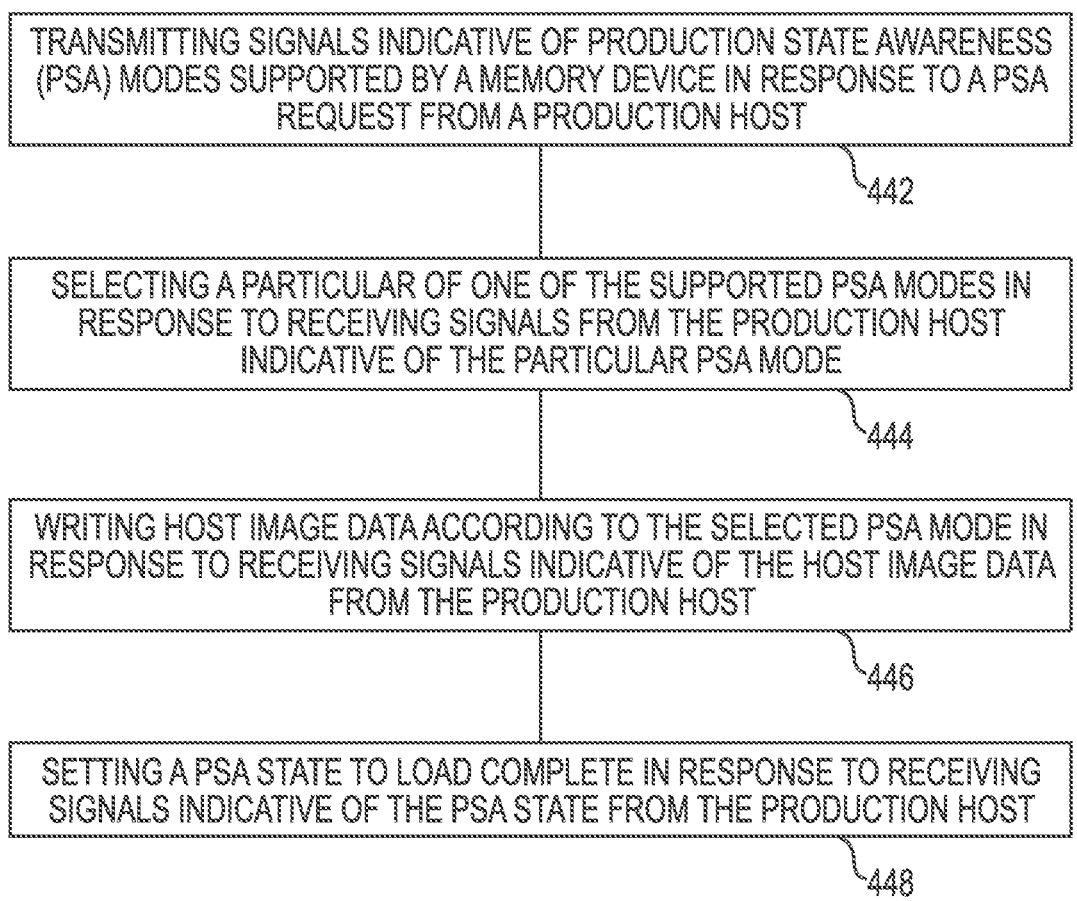
FIG. 4 is a flow diagram of an example method for production state awareness selection accordance with some embodiments of the present disclosure.

FIG. 4 is a flow diagram of an example method for production state awareness selection accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the production host 101, memory device 120, and/or local media controller 122 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 442 in the example method of FIG. 4, a memory device can transmit signals indicative of PSA modes supported by the memory device in response to a PSA request from a production host. Although not specifically illustrated, the method can include transmitting a respective data capacity associated with each of the PSA modes in response to the PSA request. For example, different PSA modes may have different capacity limits associated therewith (e.g., ⅓ capacity of the memory device, ½ capacity etc.). In response to such signaling, the method can include receiving signals indicative of an amount of host image data to be sent from the production host. The production host can indicate amount of host image data to the memory device to allow the memory device to confirm that an appropriate PSA mode has been selected based on the capacity limits of the PSA mode. The method can include transmitting signals indicative of a respective maximum quantity of reflows associated with each of the PSA modes in response to the PSA request from the production host.

At block 444 in the example method of FIG. 4, the memory device can select a particular one of the supported PSA modes in response to receiving signals from the production host indicative of the particular PSA mode. At block 446 in the example method of FIG. 4, the memory device can write host image data according to the selected PSA mode in response to receiving signals indicative of the host image data from the production host. The host image data can be written according to the selected PSA mode by programming memory cells of the memory device with a quantity of bits per cell based on the selected PSA mode and/or by programming the memory cells with a trim set tailored to the selected PSA mode.

At block 448 in the example method of FIG. 4, the memory device can set a PSA state to load complete in response to receiving signals indicative of the PSA state from the production host. The method can include powering down the memory device in response to the PSA state being set to load complete. After the memory device is soldered to the memory sub-system, the method can include powering up the memory device and setting the PSA state to soldered.

Figure 5:
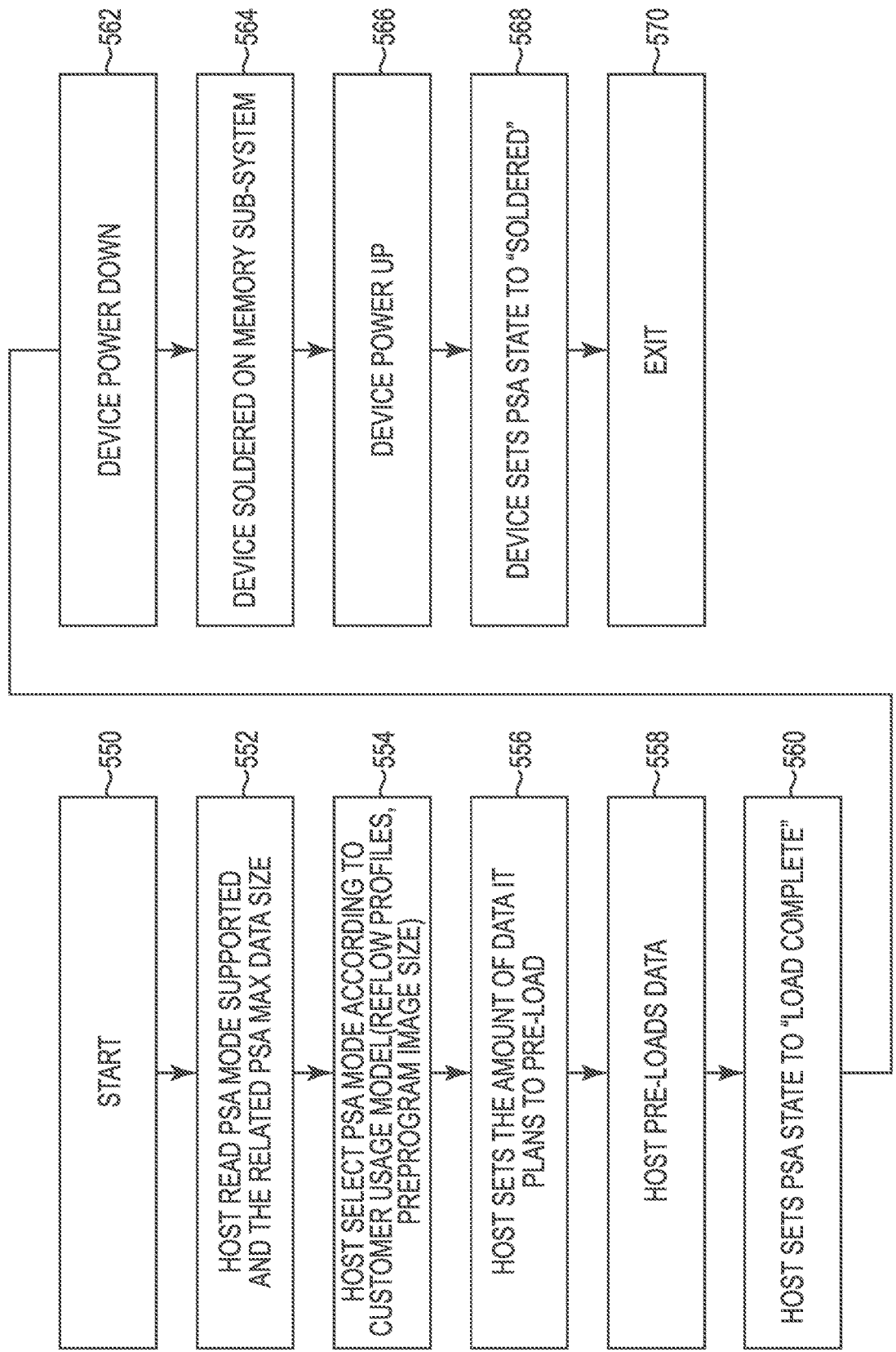
FIG. 5 is a flow diagram of an example method for production state awareness selection accordance with some embodiments of the present disclosure.

FIG. 5 is a flow diagram of an example method for production state awareness selection accordance with some embodiments of the present disclosure. The method can start at block 550 and proceed to block 552 where the production host can read the supported PSA modes and related PSA max data size from the memory device. In some embodiments, the production host can read that information directly from the memory device. In some embodiments, the production host can cause the memory device to transmit signals indicative of the supported PSA modes by virtue of a PSA request.

At block 554, the production host can select a PSA mode. That selection can be made based on a customer usage model. The customer usage model can include an indication of reflow profiles (e.g., how many or how few reflows the customer desires to support during soldering of the memory device to the memory sub-system) and/or an indication of a size of the host image data ("preprogram image size"). At block 556, the production host can set the amount of data (e.g., host image data) that it plans to transmit ("pre-load") to the memory device. The production host can set this value internally and/or share the value with the memory device.

At block 558 the production host can transmit the host image data ("pre-loads data") to the memory device. At block 560, the production host can set (or cause the memory device to set) the PSA state to load complete.

At block 562, the memory device can power down and be soldered to the memory sub-system at block 564. At block 566, the memory device can power up again and set the PSA state to soldered at block 568. At block 570, the method can end ("exit").

A set of instructions, for causing a machine to perform one or more of the methodologies discussed herein, can be executed. The instructions an include causing a memory device to transmit signals indicative of PSA modes supported by the memory device (e.g., via a production host interface) and operating the memory device in accordance with a selected one or more of the PSA modes (e.g., received via the production host interface). The PSA modes can include a first selectable PSA mode defining a data density per memory cell for programming host image data to the memory device, a second selectable PSA mode defining a trim set for programming the host image data to the memory device, and a third selectable PSA mode defining an amount of memory available for programming the host image data to the memory device. The instructions can further cause the host image data to be programmed to the memory device according to the selected PSA mode(s), cause data indicative of a load complete PSA state to be stored after programming, and cause the memory device to power down thereafter. After a subsequent powerup of the memory device, the instructions can cause the data indicative of the load complete PSA state to be replaced with data indicative of the fact that the memory device has been soldered to a memory sub-system.

The instructions can be executed by a processing device (e.g., one or more general-purpose processing devices such as a microprocessor, a central processing unit, or the like). More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device can also be one or more special-purpose processing devices such as an ASIC, an FPGA, a digital signal processor (DSP), network processor, or the like. The processing device is configured to execute instructions for performing the operations and steps discussed herein. In some embodiments, the instructions can be communicated over a network interface device to communicate over a network.

A machine-readable storage medium (also known as a computer-readable medium) can store one or more sets of instructions or software embodying one or more of the methodologies or functions described herein. The instructions can also reside, completely or at least partially, within main memory and/or within a processing device during execution thereof by a computing system. The main memory and the processing device can also constitute machine-readable storage media.

The term "machine-readable storage medium" should be taken to include a single medium or multiple media that store the one or more sets of instructions. The term "machine-readable storage medium" should also be taken to include a medium that is capable of storing or encoding a set of instructions for execution by the machine and that cause the machine to perform one or more of the methodologies of the present disclosure. The term "machine-readable storage medium" should accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a machine-readable storage medium, such as, but not limited to, types of disks, semiconductor-based memory, magnetic or optical cards, or other types of media suitable for storing electronic instructions.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer).

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   transmitting signals indicative of production state awareness (PSA) modes supported by a memory device in response to a PSA request from a production host;
   transmitting signals indicative of a respective maximum quantity of reflows associated with each of the PSA modes in response to the PSA request from the production host;
   selecting a particular of one of the supported PSA modes in response to receiving signals from the production host indicative of the particular PSA mode;
   writing host image data according to the selected PSA mode in response to receiving signals indicative of the host image data from the production host; and
   setting a PSA state to load complete in response to receiving signals indicative of the PSA state from the production host.

2. The method of claim 1, wherein writing the host image data according to the selected PSA mode comprises programming memory cells of the memory device with a number of bits per cell based on the selected PSA mode.

3. The method of claim 1, wherein writing the host image data according to the selected PSA mode comprises programming memory cells with a trim set tailored to the selected PSA mode.

4. The method of claim 1, further comprising transmitting a respective data capacity associated with each of the PSA modes in response to the PSA request from the production host.

5. The method of claim 4, further comprising receiving signals indicative of an amount of host image data to be sent from the production host.

6. The method of claim 1, further comprising powering down the memory device in response to the PSA state being set to load complete.

7. The method of claim 6, further comprising, after the memory device is soldered to a memory sub-system:
   powering up the memory device; and
   setting the PSA state to soldered.

8. An apparatus, comprising:
   a production host interface;
   a memory array coupled to the production host interface; and
   registers coupled to the production host interface, wherein the registers store:
     data indicative of production state awareness (PSA) modes supported by the apparatus;
     data indicative of a respective maximum quantity of reflows associated with each of the PSA modes; and
     data indicative of a PSA state of the apparatus;
   wherein the apparatus is configured to:
     receive signals indicative of a selection of a PSA mode via the production host interface;
     program host image data received via the production host interface to the memory array according to the selected PSA mode; and
     reprogram the data indicative of the PSA state after the apparatus is soldered to a memory sub-system.

9. The apparatus of claim 8, wherein when in a first PSA mode, the apparatus is configured to program the host image data to memory cells of the memory array at a first quantity of bits per cell; and
   wherein when in a second PSA mode, the apparatus is configured to program the host image data to memory cells of the memory array at a second quantity of bits per cell greater than the first quantity.

10. The apparatus of claim 8, wherein when in a first PSA mode, the apparatus is configured to program the host image data to memory cells of the memory array with a first trim set; and
    wherein when in a second PSA mode, the apparatus is configured to program the host image data to memory cells of the memory array with a second trim set providing lesser reflow capability than the first PSA mode.

11. The apparatus of claim 8, wherein when in a first PSA mode, the apparatus is configured to limit host image data to a first portion of a capacity of the memory array; and
    wherein when in a second PSA mode, the apparatus is configured to limit host image data to a second portion of the capacity of the memory array greater than the first portion.

12. The apparatus of claim 8, wherein the apparatus is further configured to transmit signals via the production host interface indicative of the data stored in the registers in response to a PSA request received via the production host interface.

13. The apparatus of claim 8, wherein the apparatus is configured to reprogram the data indicative of the PSA state after programming the host image data and before the apparatus is soldered to the memory sub-system.

14. The apparatus of claim 8, wherein the registers comprise universal flash storage (UFS) descriptors.

15. The apparatus of claim 8, wherein the registers comprise embedded multimedia card (eMMC) extended card specific data (ECSD) registers.

16. A non-transitory machine readable medium storing instructions executable to:
    cause a memory device to transmit signals indicative of a plurality of production state awareness (PSA) modes supported by the memory device;
    cause the memory device to transmit signals indicative of a respective maximum quantity of reflows associated with each of the plurality of PSA modes; and
    operate the memory device in accordance with a selected one or more of the plurality of PSA modes;
    wherein the plurality of PSA modes include:
      a first selectable PSA mode defining a data density per memory cell for programming host image data to the memory device;
      a second selectable PSA mode defining a trim set for programming the host image data to the memory device; and
      a third selectable PSA mode defining an amount of memory available for programming the host image data to the memory device.

17. The medium of claim 16, wherein the instructions to transmit the signals indicative of the plurality of PSA modes comprise instructions to transmit the signals via a production host interface; and
    further comprising instructions to receive signals indicative of the selected one or more of the plurality of PSA modes via the production host interface.

18. The medium of claim 16, further comprising instructions to:
    program the host image data to the memory device according to the selected one or more of the plurality of PSA modes;
    store data indicative of a load complete PSA state in response to the host image data being programmed; and
    power down the memory device in response to the load complete PSA state being stored.

19. The medium of claim 18, further comprising instructions to replace the data indicative of the load complete PSA state with data indicative of a soldered PSA state in response to a subsequent powerup of the memory device.

\* \* \* \* \*